United States Patent

Hertrich et al.

[11] Patent Number: 5,583,060
[45] Date of Patent: Dec. 10, 1996

[54] METHOD FOR MANUFACTURING FIELD EFFECT CONTROLLED SEMICONDUCTOR COMPONENTS

[75] Inventors: Helmut Hertrich, Fahrenzhausen; Helmut Strack, Munich; Jenoe Tihanyi, Kirchheim, all of Germany

[73] Assignee: Siemens Aktiengesellschaft, Munich, Germany

[21] Appl. No.: 552,702

[22] Filed: Nov. 3, 1995

[30] Foreign Application Priority Data

Nov. 4, 1994 [DE] Germany ............... 44 39 531.0

[51] Int. Cl.$^6$ ............... H01L 21/8224; H01L 21/8234
[52] U.S. Cl. ............... 437/31; 437/26; 437/40; 437/203; 148/DIG. 126
[58] Field of Search ............... 437/31, 29, 40 DM, 437/41 DM, 913, 203, 26; 148/DIG. 126

[56] References Cited

U.S. PATENT DOCUMENTS

| | | | |
|---|---|---|---|
| 4,466,176 | 8/1984 | Temple | 437/44 |
| 4,823,172 | 4/1989 | Mihara | 257/144 |
| 5,084,401 | 1/1992 | Hagino | 437/31 |
| 5,173,435 | 12/1992 | Harada | 437/31 |
| 5,302,537 | 4/1994 | Strack | 148/DIG. 126 |
| 5,380,670 | 1/1995 | Hagino | 148/DIG. 126 |

*Primary Examiner*—T. N. Quach
*Assistant Examiner*—Michael Trinh
*Attorney, Agent, or Firm*—Hill, Steadman & Simpson

[57] ABSTRACT

The base zones of MOSFETs and IGBTs are generated by implanting dopants of the second conductivity type into the surface of a first layer of the first conductivity type, and a second layer of the first conductivity type is deposited thereon. During the deposition, the dopants diffuse up to the surface of the second layer and form base zones. The base zones are thereby provided with a laterally expanded region of high conductivity under the surface through which the minority carriers can flow off to the source electrode with low voltage drop.

10 Claims, 1 Drawing Sheet

METHOD FOR MANUFACTURING FIELD EFFECT CONTROLLED SEMICONDUCTOR COMPONENTS

BACKGROUND OF THE INVENTION

1. Field of the Invention

The invention is generally directed to semiconductors and more specifically to a method for manufacturing a semiconductor component controllable by field effect.

2. Description of the Related Art

Such semiconductor components can, for example, be power MOSFETs or IGBTs. A problem common to both types of power semiconductor component is that minority charge carriers generated in the drain zone or, respectively, inner zone, given an overload of the semiconductor component, can produce such a high voltage drop at the pn-junction between source zone and base zone that parasitic bipolar structures are activated. When this occurs, the current in the semiconductor component continues to rise steeply and the semiconductor component is destroyed by secondary breakdown.

SUMMARY OF THE INVENTION

An object of the present invention is to provide a method for manufacturing field effect controlled semiconductor components in which the structure of the components avoids secondary breakdown.

This object is achieved by a method for manufacturing field effect controlled semiconductor components having the steps of: providing a first layer of a first conductivity type on a substrate, wherein the first layer has a surface; generating zones of a second conductivity type in the surface of the first layer by implantation of dopants. The zones of the second conductivity type have lateral dimensions. The method includes the steps of epitaxially depositing a second layer of the first conductivity type on the first layer and the zones of the second conductivity type upon all around diffusion of dopants out of the zones of the second conductivity type thereby generating base zones, wherein the second layer has a surface, generating source zones in the surface of the second layer over the base zones such that the lateral dimensions of the zones of the second conductivity type are at least congruent with the source zones; generating via openings that extend to the dopant maximum of the base zones in the source zones and base zones; and electrically connecting the source zones and the base zones to one another by a metal layer extending into the via openings.

The invention shall be set forth with reference to two exemplary embodiments in conjunction with the figures.

DETAILED DESCRIPTION OF THE PREFERRED EMBODIMENTS

Figure 1:
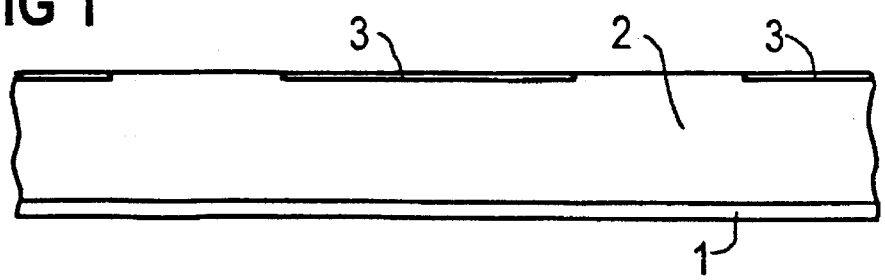
FIG. 1 illustrates a semiconductor component after a characteristic method step of a first exemplary embodiment of the present invention.
Figure 2:
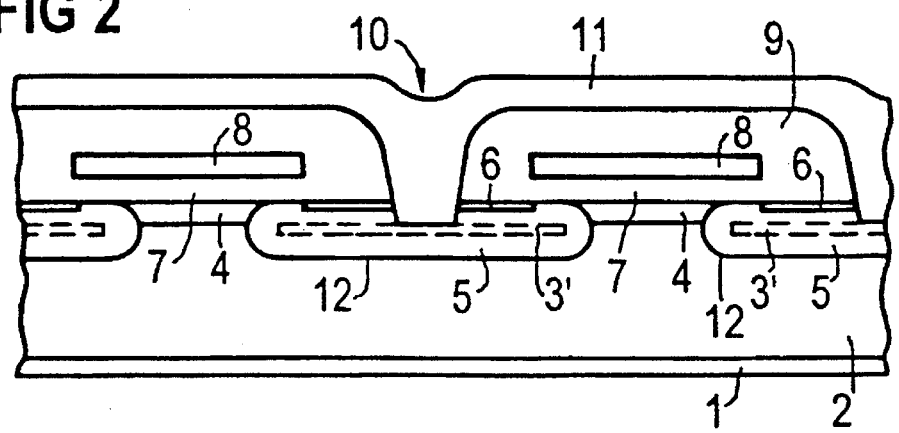
FIG. 2 illustrates a semiconductor component a section through a finished semiconductor component according to the first exemplary embodiment of the present invention.

The semiconductor component of FIGS. 1 and 2 is based on a substrate 1 on which a first layer 2 composed of semiconductor material is applied. The first layer 2 can be epitaxially deposited on the substrate 1. The first layer 2, however, can also be a wafer cut off from a semiconductor rod into which dopants that then form the substrate 1 are introduced on the underside by implantation or diffusion. The first layer 2 forms a part of the drain zone of the semiconductor component to be produced. The thickness of the first layer 2 is preferably between 5 and 100 µm.

Zones 3 of a second conductivity type are formed in the upper side of the first layer 2 by implantation of dopants. For example, the dopants can be implanted into the surface of the first layer 2 through a structured mask of a deposited oxide or of a structured, locally grown oxide. For example, a dose of greater than or equal to $10^{15}$ cm$^{-2}$ boron is suitable.

Next, epitaxial semiconductor material of the first conductivity type is deposited onto the entire surface, i.e. onto the free surface of the first layer 2 and the surface of the zones 3. A second layer 4 (see FIG. 2) having a thickness of, for example, 0.1 through 5 µm thereby arises. Together, the layers 2 and 4 form the drain zone of the semiconductor component. The doping concentration of the second layer 4 can correspond to that of the first layer 2; however, it can also be higher. The epitaxial deposition of the second layer 4 generally occurs at a temperature between 900° and 1000° C. The dopants of the second conductivity type thereby diffuse out of the zone 3 on all sides. As a result, base zones 5 arise. The maximum of the dopant concentration thereby lies at the location of the original implanted zones 3. The dopant maximums are entered with broken lines in FIG. 2 and are referenced 3'. Proceeding from 3', the doping concentration of the base zones 5 decreases toward the surface of the semiconductor body, i.e. toward the surface of the second layer 4, as it does laterally and in the direction of the substrate 1. A pn-junction between the base zones 5 and the drain zone formed by the layers 2, 4 is referenced 12. The cutoff voltage can be kept low due to the relatively low doping.

The surface of the semiconductor body is then covered with an oxide layer 7 on which a polysilicon layer is deposited. The polysilicon layer is structured and forms the gate electrode 8. Dopants of the first conductivity type that form the source zones 6 are subsequently implanted into the surface of the base zones 5 using the gate electrode as mask.

After deposition of a further oxide layer 9 on the gate electrode 8, via openings 10 are generated in the region of the source zones 6 and of the base zones 5. The via openings 10 go through the source zones 6 to the dopant maximum 3' of the base zones 5. This dopant maximum projects beyond the source zones 6 in lateral direction and extends under the gate electrodes 8. A metal layer 11 that contacts both the source zones 6 as well as the base zones 5 is deposited on the surface of the second oxide layer 9. Due to the great lateral expanse of the dopant maximum, minority charge carriers deriving from the first layer 2 are captured and proceed to the source electrode 11. Due to the high conductivity of the zone 3, the voltage drop at the pn-junction between the source zones 6 and the base zones 5 is not adequate for achieving the necessary 0.5 volts for the emission of charge carriers.

Figure 3:
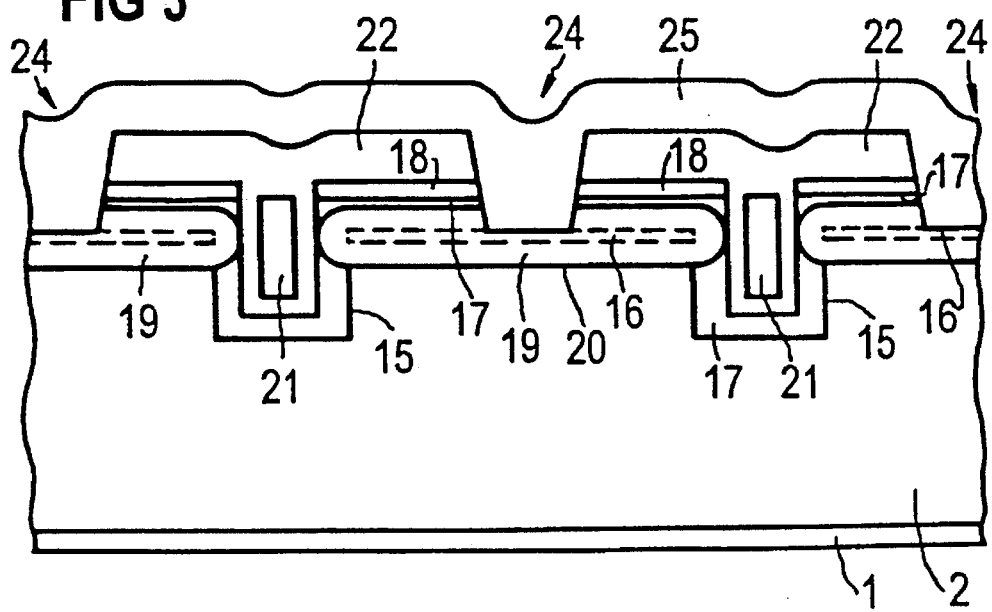
FIG. 3 illustrates a semiconductor component a section through a finished semiconductor component according to a second exemplary embodiment of the present invention.

The semiconductor component according to FIG. 3 differs from that of FIG. 2 principally in that the first layer 2 is provided with trenches 15 in which vertical gate electrodes 21 are arranged insulated. The semiconductor component of FIG. 3 is manufactured such that dopants of the second conductivity type are implanted into the entire surface of the first layer 2 before the trenches 15 are generated. These dopants form a layer 16. Subsequently, the trenches 15 are generated and the layer 16 is removed here. A second layer 17 covering the entire surface of the semiconductor body, including the walls of the trenches 15, is then epitaxially deposited. During the epitaxial growth, the dopants contained in the layer 16 diffuse both into the first layer 2 as well as into the second layer 17. They also redope a part of the second layer 17 deposited at the walls of the trenches 15. Base zones 19 that extend up to the sidewalls of the trenches 15 are generated by the diffusion of the dopants out of the zones 16. A diffusion up to the horizontal surface of the second layer 17 is not necessary but is generally not harmful.

Dopants of the first conductivity type that form source zones 18 are implanted into the surface of the second layer 17 outside the trenches 15. An implantation into the second layer 17 extending into the trenches 15 is prevented by appropriate masking.

The gate electrodes 21 are generated in the trenches 15 after deposition of a first oxide layer on the zones 18 and in the trenches 15. The gate electrodes 21 are subsequently covered by a further oxide layer. For the sake of simplicity, the two oxide layers are referenced with a single reference numeral 22. The oxide layer 22 is then provided with via openings 24 in the region of the source zones 18 and the base zones 19. As in the exemplary embodiment of FIG. 2, these via openings extend up to the maximum 16 of the dopant concentration of the base zones 19. The pn-junction between the base zones 19 and the drain zone is referenced 20. After producing the via openings 24, a metal layer that contacts the source zones and the base zones 19 at their dopant maximum 16 is applied onto the entire surface.

Here, the dopant maximum of the base zone 19 extends from trench to trench. Minority charge carriers deriving from the inside of the semiconductor body are therefore nearly as effectively captured by the highly doped zone 16 and conducted to the source electrode 25 as in the exemplary embodiment of FIG. 2.

In a power MOSFET, the substrate 1 has the same conductivity type as the drain zone 2,4 but is substantially more highly doped than the latter. In an IGBT, the substrate 1 has the conductivity type opposite that of the zone 2.

The base zones and the source zones are preferably fashioned cell-like. If the temperature at which epitaxial deposition is undertaken does not suffice for generating the base zones, then re-diffusion can be subsequently carded out with a higher temperature. Further dopants can be implanted surface-wide into the surface of the semiconductor body for setting the cutoff voltage alter the base zones and source zones have been produced.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim:

1. Method for manufacturing a field effect controlled semiconductor component, comprising the steps of:

providing a first layer of a first conductivity type on a substrate, the first layer having a surface;

generating zones of a second conductivity type in the surface of the first layer by implantation of dopants, the zones of the second conductivity type having lateral dimensions;

epitaxially depositing a second layer of the first conductivity type on the first layer and the zones of the second conductivity type upon all around diffusion of dopants out of the zones of the second conductivity type thereby generating base zones, the second layer having a surface;

generating source zones in the surface of the second layer over the base zones such that the lateral dimensions of the zones of the second conductivity type are at least congruent with the source zones;

generating via openings that extend to the dopant maximum of the base zones in the source zones and base zones; and electrically connecting the source zones and the base zones to one another by a metal layer extending into the via openings.

2. Method according to claim 1, wherein following the epitaxial deposition of the second layer, the method further comprises the step of:

exposing the semiconductor component to a higher temperature than the temperature at which the second layer was epitaxially deposited.

3. Method according to claim 1, wherein the step of generating source zones in the second layer at the surface of the semiconductor body is further defined by generating the source zones by implantation of dopants.

4. Method according to claim 1, further comprising the step of:

implanting dopants surface-wide into the surface of the semiconductor body after the epitaxial deposition of the second layer and the production of the source zones and base zones.

5. Method according to claim 1, wherein the base zones and the source zones are generated cell-like.

6. Method for manufacturing a field effect controlled semiconductor component, comprising the steps of:

providing a first layer on a substrate of a semiconductor body, the first layer having a surface;

generating a zone of a second conductivity type in the surface of the first layer by implantation of dopants;

generating trenches in the surface of the first layer, wherein the trenches are constructed and arranged to accept vertical gate electrodes thereby producing a plurality of base zones of the second conductivity type;

epitaxially depositing a second layer of the first conductivity type on the zones of the second conductivity type and at the walls of the trenches upon all around diffusion of dopants out of the zones of the second conductivity type thereby generating base zones;

providing the base zones of the second conductivity type with such dimensions that their dopants in the trenches extend up to the surface of the second layer;

generating source zones in the second layer at the surface of the semiconductor body;

generating via openings that extend up to the dopant maximum of the zones of the second conductivity type in the source zones and in the second layer at the surface of the semiconductor body; and electrically connecting the source zones and the base zones of the second conductivity type to one another by a metal layer extending into the via openings.

7. Method according to claim 6, wherein the step of generating source zones in the second layer at the surface of the semiconductor body is further defined by generating the source zones by implantation of dopants.

8. Method according to claim 6, further comprising the step of:

implanting dopants surface-wide into the surface of the semiconductor body after the epitaxial deposition of the second layer and the production of the source zones and base zones.

9. Method according to claim 6, wherein the base zones and the source zones are generated cell-like.

10. Method according to claim 6, following the epitaxial deposition of the second layer, exposing the semiconductor component to a higher temperature than the temperature at which the second layer was epitaxially deposited.

\* \* \* \* \*